United States Patent [19]

Rempfer et al.

[11] Patent Number: 4,624,006
[45] Date of Patent: Nov. 18, 1986

[54] BIDIRECTIONAL SHIFT REGISTER USING PARALLEL INVERTERS WITH ADJUSTABLE TRANSCONDUCTANCE

[75] Inventors: William C. Rempfer, Santa Clara; Thomas P. Redfern, San Jose, both of Calif.

[73] Assignee: Linear Technology Corporation, Milpitas, Calif.

[21] Appl. No.: 732,660

[22] Filed: May 10, 1985

[51] Int. Cl.⁴ .............................................. G11C 19/28
[52] U.S. Cl. ...................................... 377/69; 307/242
[58] Field of Search ................ 377/69, 115, 116, 117, 377/67, 77, 78, 79; 307/241, 242

[56] References Cited

U.S. PATENT DOCUMENTS

| | | | |
|---|---|---|---|
| 3,584,308 | 6/1971 | Neu | 377/67 |
| 3,769,525 | 10/1973 | Foss et al. | 307/241 |
| 4,154,978 | 5/1979 | Tu | 307/242 |

Primary Examiner—John S. Heyman
Assistant Examiner—K. Ohralik
Attorney, Agent, or Firm—Flehr, Hohbach, Test, Albritton & Herbert

[57] ABSTRACT

A bidirectional shift register includes a plurality of serially connected cells with each cell having a first circuit portion and a second circuit portion. Each circuit portion includes at least two parallel inverters connected in opposite directions. The relative transconductance of the oppositely connected inverters in each circuit portion of a cell can be varied thereby determining the direction of data flow through the circuit portion and through the bidirectional shift register.

6 Claims, 6 Drawing Figures

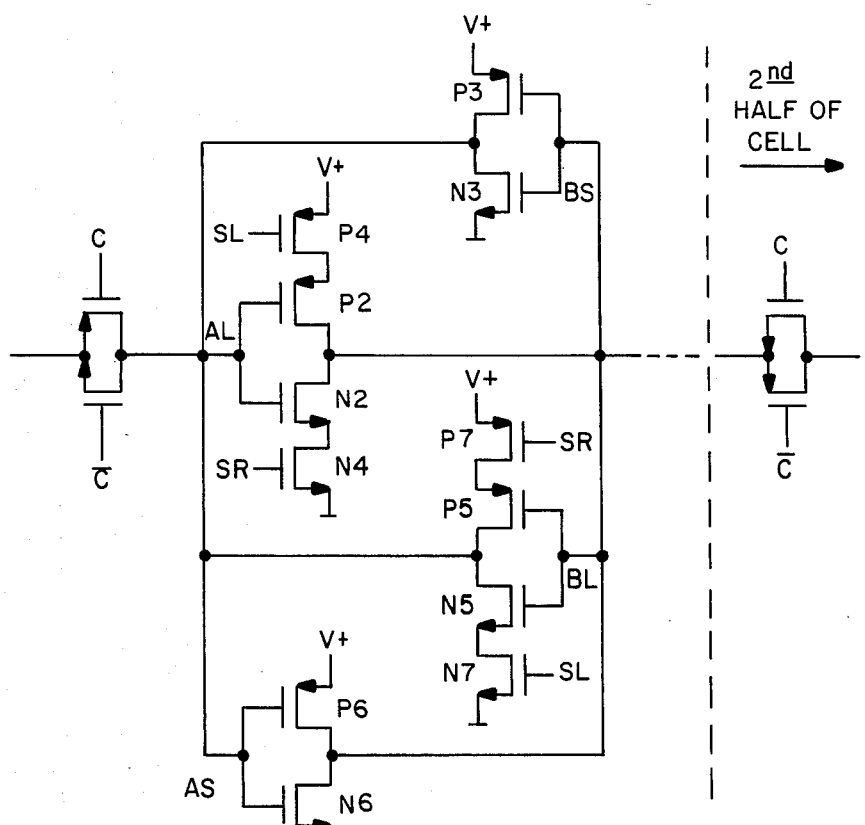
FIG. −5
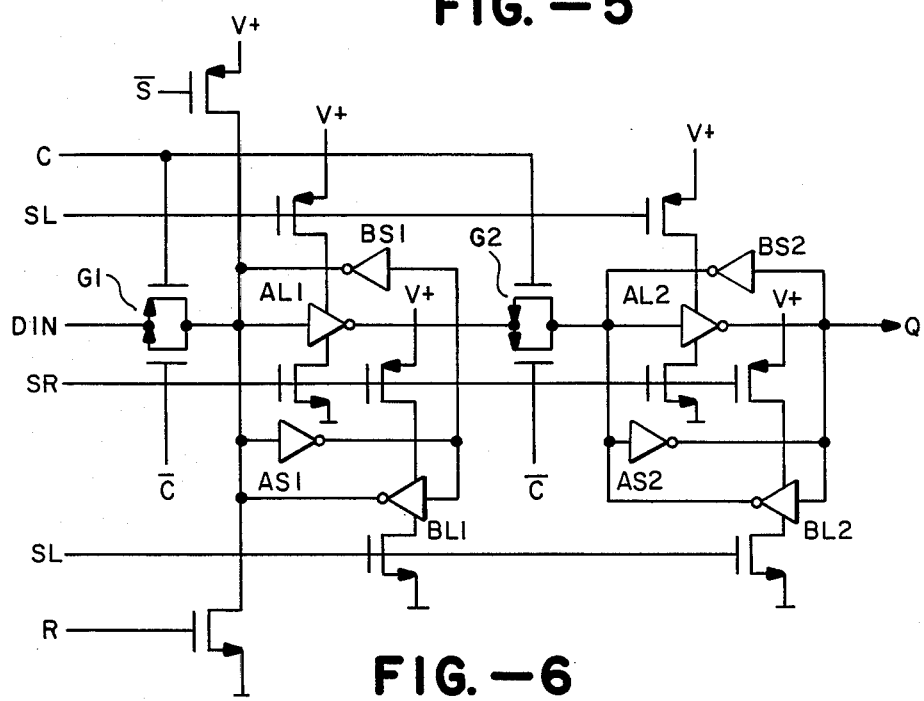
FIG. −6

BIDIRECTIONAL SHIFT REGISTER USING PARALLEL INVERTERS WITH ADJUSTABLE TRANSCONDUCTANCE

This invention relates generally to digital circuits, and more particularly the invention relates to a bidirectional shift register.

The shift register utilizes a series of flip-flops or inverters to perform a displacement or movement of a set of digits either to the right or to the left. The conventional unidirectional shift register is designed with parallel, oppositely connected inverters with the direction of data flow determined by the inverter with the larger transconductance, $g_m$. The shifting operation can effect a multiplication, a division, a time delay, or storage function. The ability to unload the stored data from either end of the register is desirable in many applications where least significant bits (LSB) or most significant bits (MSB) data format is required.

An object of the present invention is an improved and versatile shift register.

Another object of the invention is a shift register which is selectively directional in data flow.

A feature of the invention is parallel, oppositely connected inverter means with the transconductance of the inverter means being variable for controlling the direction of data flow.

The invention and objects and features thereof will be more readily apparent from the following detailed description and appended claims when taken with the drawing, in which:

FIG. 5 is a more detailed schematic of the embodiment of FIG. 3.

FIG. 6 is a schematic of one cell of a shift register employing the inverters of FIG. 5.

Figure 1:
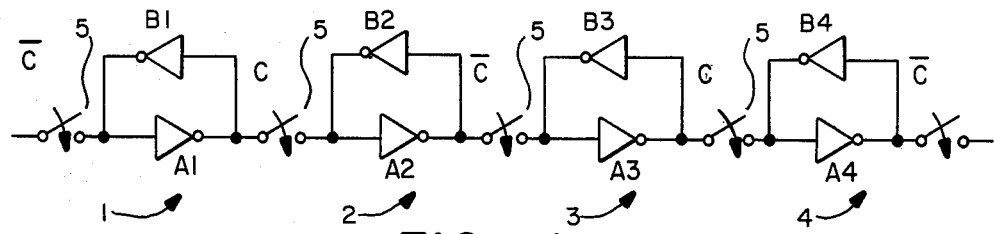
FIG. 1 is an electrical schematic of a conventional shift register.

Referring now to the drawings, FIG. 1 is an electrical schematic of a digital shift register in which a plurality of parallel inverters 1, 2, 3, and 4 are interconnected by switches 5 which are alternately closed in response to complementary clock signals, C and $\overline{C}$. Each set of inverters comprises one inverter, A, having a much larger transconductance, $g_m$, than the other inverter, B. Accordingly, the inverters $A_x$ will overpower the inverters $B_x$ and data will transfer to the right through the $A_x$ inverters. For example, during clock cycle C, inverter A1 overpowers inverter B2 (assuming that there is any disagreement between their outputs), and inverter A3 will overpower inverter B4, and data will transfer to the right from the odd numbered inverter pairs to the even numbered inverter pairs. During clock cycle $\overline{C}$, inverters A2 and A4 will overpower inverters B3 and B5, respectively, and data will again shift right. With continuous clocking data will continue to shift to the right solely because of the transconductance of the inverters $A_x$ are much larger than the transconductance of the inverters $B_x$. The switches are inherently bidirectional and the clocking signals show no sense of directional preferance, therefore the relative inverter strengths or transconductance determine the direction of data flow.

Figure 2:
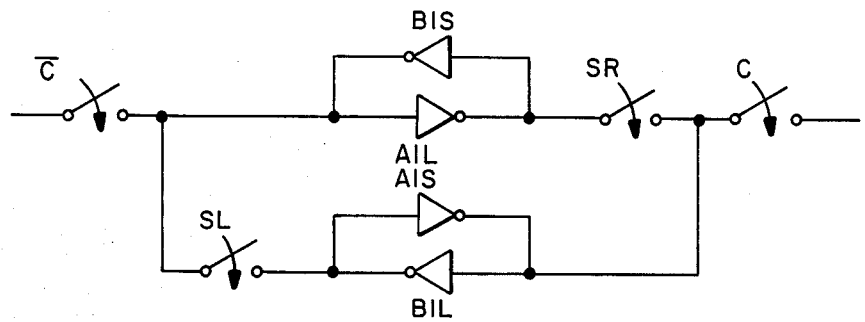
FIG. 2 is an electrical schematic of a circuit portion of a cell of a shift register in accordance with one embodiment of the invention.

In accordance with the present invention a shift register designed with inverters is made bidirectional by varying the transconductance of the parallel inverter pairs. FIG. 2 is an electrical schematic of one embodiment of the invention in which two pairs of parallel inverters are connected in parallel and selectively switched in the circuit by a shift right ($S_R$) switch or a switch left ($S_L$) switch. A first inverter pair includes an inverter $A_{1L}$ connected in parallel with an oppositely connected inverter $B_{1S}$. The transconductance of inverter $A_{1L}$ is large relative to the small transconductance of the inverter $B_{1S}$. Similarly, the second pair of inverters includes an inverter $A_{1S}$ which has a small transconductance relative to the large transconductance of the oppositely connected parallel inverter $B_{1L}$. Thus, when switch $S_R$ is closed and switch $S_L$ is open, data will flow to the right because of the large transconductance of inverter $A_{1L}$ as compared to the transconductance of inverter $B_{1S}$. Conversely, when the left switch $S_L$ is closed and the right switch $S_R$ is open then data will flow to the left since the transconductance of inverter $B_{1L}$ is large compared to the small conductance of inverter $A_{1S}$.

Figure 3:
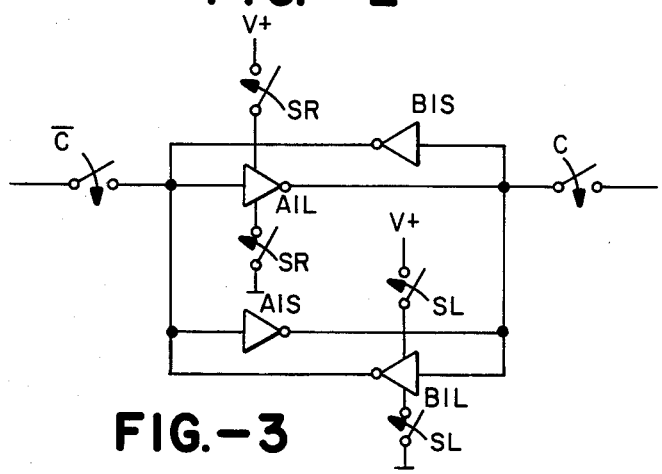
FIG. 3 is an electrical schematic of a circuit portion of a cell of a shift register in accordance with another embodiment of the invention.

FIG. 3 is another embodiment of the invention which is similar to the embodiment of FIG. 2 but in which the directional switches control the activation of inverter $A_{1L}$ for a right shift and inverter $B_{1L}$ for a left shift. When switches $S_R$ are closed and switches $S_L$ are open then data will flow to the right, conversely when switches $S_L$ are closed and switches $S_R$ are open then data will flow to the left due to the relative transconductance of the active inverters.

Figure 4:
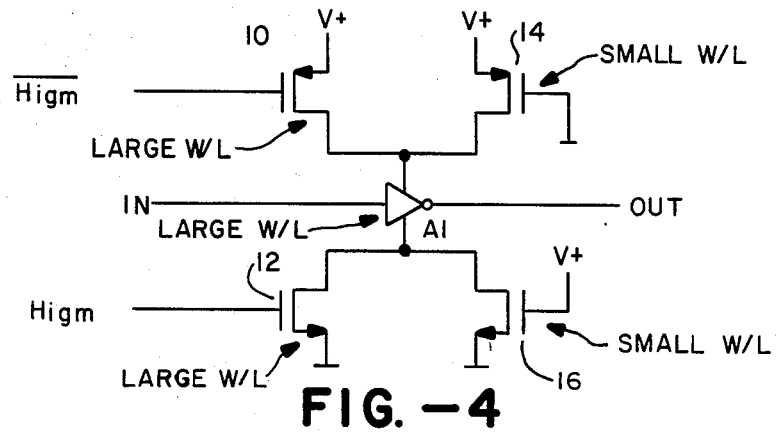
FIG. 4 is an electrical schematic of a circuit portion of a cell of a shift register in accordance with yet another embodiment of the invention.

FIG. 4 is an electrical schematic of yet another embodiment of the invention which permits the use of only two inverters (e.g. A1 and B1) and in which the transconductance of each inverter is controlled by providing pairs of transistors for energizing the inverter with the pairs of transistors having different channel width to length (W/L) ratios and hence different transconductance values. For example, in FIG. 4 a large transconductance for inverter $A_1$ is provided by energizing inverter A1 through transistors 10 and 12 each of which has a large W/L ratio. Conversely, a lower transconductance is provided for inverter A1 by energizing the inverter through transistors 14 and 16 which have small W/L ratios. N channel transistor 12 is controlled by a high transconductance signal, Higm, and P channel transistor 10 is controlled by a complementary control signal, $\overline{\text{Higm}}$.

FIG. 5 is a detailed schematic of one-half of a shift register cell based on the embodiment of FIG. 3. A small transconductance inverter, $A_S$, and a small transconductance inverter, $B_S$, are connected in parallel with the controllable large transconductance inverters $A_L$ and $B_L$. Selective energization of the large transconductance inverters, $A_L$ and $B_L$, is controlled by a shift left signal, SL, and a shift right signal, SR. In this embodiment the width to length ratio, W/L, is small for the transistors N3, P3, N6, and P6. The width to length ratio, W/L, is large for the transistors N2, P2, N4, P4, N5, P5, N7, and P7.

FIG. 6 is an electrical schematic of a complete cell based on the schematic of FIG. 5. The first half of the cell includes the four inverters $A_{L1}$, $A_{S1}$, $B_{L1}$, and $B_{S1}$ connected as shown in the schematic of FIG. 5 with the shift left signal, $S_L$, and the shift right signal, $S_R$ controlling the energization of inverters $A_{L1}$ and $B_{L1}$. Similarly, the second half of the cell includes the four inverters $A_{L2}$, $A_{S2}$, $B_{L2}$, and $B_{S2}$ which are connected as shown in the schematic of FIG. 5 and with the energization of the inverters $A_{L2}$ and $B_{L2}$ being controlled by the signals $S_L$ and $S_R$. The input data is applied to each half of the cell through complementary gates G1 and G2 which are respectively controlled by the complementary signals $\overline{C}$ and C. Importantly, the circuit is immune to shift right and shift left crossover transients when data on the cell nodes is stable.

There has been described several embodiments of a shift register in which the direction of data flow is controlled by reversing the relative transconductance of the right pointing inverters and the left pointing inverters of a conventional shift register design. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A bidirectional shift register comprising
a plurality of cells,
first gate means for serially connecting said plurality of cells,
each cell including first and second circuit portions interconnected by a second gate means, each of said circuit portions including first and second inverter means connected in parallel and in opposite directions, and means for varying the transconductance of said first and second inverter means and thereby establishing the direction of data flow through said first and second circuit portions.

2. A bidirectional shift register comprising a plurality of cells,
first gate means for serially connecting said plurality of cells,
each cell including first and second circuit portions interconnected by a second gate means, each of said circuit portions including first and second inverter means connected in parallel and in opposite directions,
said first and second inverter means comprising
a first inverter and a second inverter connected in parallel and in opposite directions, said first inverter having a transconductance greater than said second inverter, and
a third inverter and a fourth inverter connected in parallel and in opposite directions, said third inverter having a transconductance less than said fourth inverter, said first inverter and second inverter being connectable in parallel with said third inverter and said fourth inverter and means for selectively actuating said first and second inverter means and thereby establishing the direction of data flow through said first and second circuit portions.

3. The bidirectional shift register as defined by claim 2 and further including a shift right switch connecting said first inverter and said second inverter between said first gate means and a second gate means, and a shift left switch connecting said third inverter and said fourth inverter between said first gate means and said second gate means.

4. The bidirectional shift register as defined by claim 2 wherein said first inverter and said fourth inverter are connected in opposite directions between said first gate means and said second gate means, and further including directional switch means for selectively activating said first inverter and said fourth inverter.

5. The bidirectional shift register as defined by claim 1 wherein said first inverter means comprises a first inverter and said second inverter means comprises a second inverter, said first inverter and said second inverter being connected in parallel and in opposite directions, and means associated with each of said first inverter and said second inverter for varying the transconductance of said first inverter and said second inverter.

6. The bidirectional shift register as defined by claim 5 wherein said means associated with said first inverter comprises two pairs of parallel field effect transistors with the transistors in each pair having different channel width to channel length ratios, said two pairs of parallel field effect transistors interconnecting said first inverter to voltage potentials, the selective conduction of said parallel field effect transistors varying the transconductance of said first inverter.

* * * * *